United States Patent

[11] 3,571,670

[72] Inventor Stanford R. Ovshinsky
Bloomfield Hills, Mich.
[21] Appl. No. 720,572
[22] Filed Apr. 11, 1968
[45] Patented Mar. 23, 1971
[73] Assignee Energy Conversion Devices, Inc.
Troy, Mich.

[54] SWITCHING DEVICE INCLUDING BORON AND SILICON, CARBON OR THE LIKE
6 Claims, 4 Drawing Figs.

[52] U.S. Cl. 317/234, 307/324, 252/62.3, 252/504
[51] Int. Cl. H01l 9/10
[50] Field of Search 317/234.10 235.25, 235.28, 235.48.3, 235.48.7; 338/20; 252/62.36; 106/47; 307/324

[56] References Cited
UNITED STATES PATENTS

| | | | |
|---|---|---|---|
| 3,271,591 | 9/1966 | Ovshinsky | 317/234 |
| 3,421,054 | 1/1969 | Helmberger et al. | 317/234 |

*Primary Examiner*—Jerry D. Craig
*Attorney*—Wallenstein, Spangenberg, Hattis & Strampel

ABSTRACT: A current switching device for an electrical circuit including a semiconductor material and electrodes in contact therewith, wherein the semiconductor material has a high electrical resistance, wherein the high electrical resistance is substantially instantaneously decreased to a low electrical resistance in response to a voltage above a threshold voltage value, wherein the low electrical resistance is immediately returned to the high electrical resistance in response to a decrease in current below a minimum current-holding value, and wherein the semiconductor material consists essentially of boron and carbon, silicon, titanium, germanium, zirconium or hafnium.

PATENTED MAR 23 1971 3,571,670

Inventor
Stanford R. Ovshinsky
By: Wallenstein, Spangenberg, Hattis & Strampel Attys.

SWITCHING DEVICE INCLUDING BORON AND SILICON, CARBON OR THE LIKE

The invention of this application is related to the invention disclosed in Ovshinsky U.S. Pat. No. 3,271,591 issued Sept. 6, 1966.

The principal object of this invention is to provide an improved switching device for accomplishing the current-controlling or switching functions substantially as performed by the current-controlling device of the aforementioned patent. In this connection a different semiconductor material is here utilized, it consisting essentially of boron and one or more of carbon, silicon, titanium, germanium, zirconium or hafnium. Exceptionally fine results are obtained when silicon and/or carbon are utilized in conjunction with boron.

Figure 1:
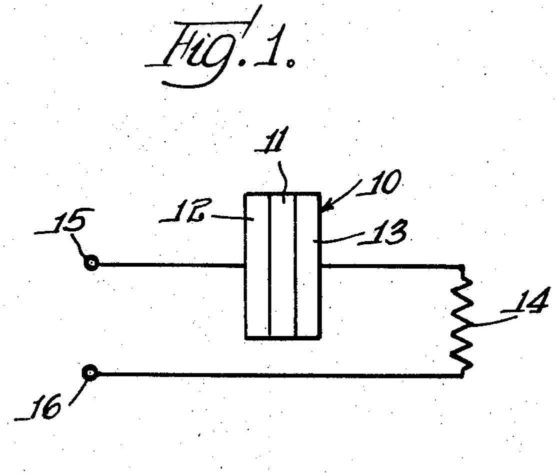
Figure 2:
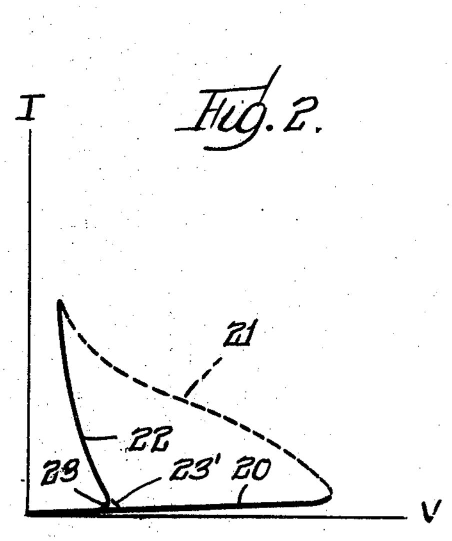
Figure 3:
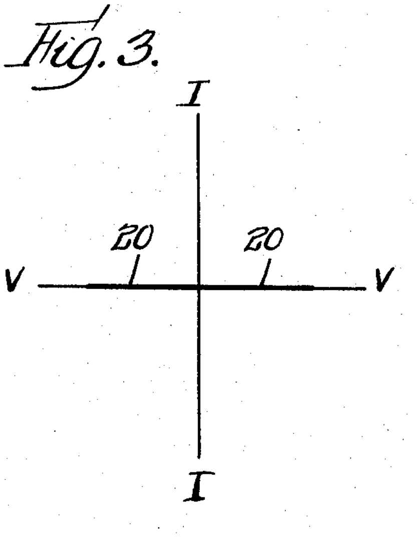
Figure 4:
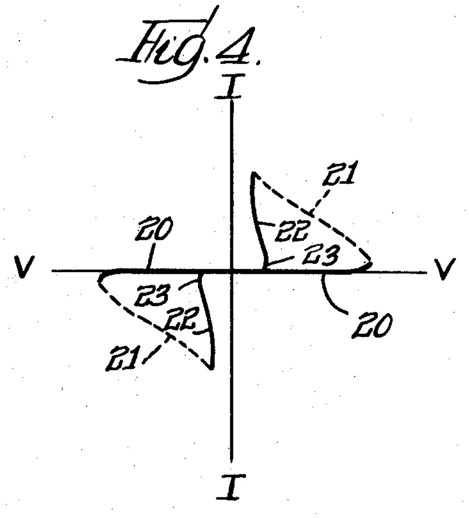

Other objects and advantages of this invention will become apparent to those skilled in the art upon reference to the accompanying specification, claims and drawing in which:

FIG. 1 is a diagrammatic illustration of the switching device of this invention connected in series in a load circuit;

FIG. 2 is a voltage current curve illustrating the operation of the switching device of this invention in a DC load circuit; and FIGS. 3 and 4 are voltage current curves illustrating the operation of the switching device when included in an AC load circuit, Referring now to the diagrammatic illustration of FIG. 1, the switching device of this invention is generally designated at 10. It includes a semiconductor material 11 which is of one conductivity type and which is of high electrical resistance and a pair of electrodes 12 and 13 in contact with the semiconductor material 11 and having a low electrical resistance of transition therewith. The electrodes 12 and 13 of the switching device 10 connect the same in series in an electrical load circuit having a load 14 and a pair of terminals 15 and 16 for applying power thereto. The power supplied may be a DC voltage or an AC voltage as desired.

FIG. 2 is an I—V curve illustrating the DC operation of the switching device 10. The device is normally in its high resistance condition and as the DC voltage is applied to the terminals 15 and 16 and increased, the voltage current characteristics of the device are illustrated by the curve 20, the electrical resistance of the device being high and substantially blocking the current flow therethrough. When the voltage is increased to a threshold voltage value, the high electrical resistance in the semiconductor material substantially instantaneously decreases in at least one path between the electrodes 12 and 13 to a low electrical resistance, the substantially instantaneous switching being indicated by the curve 21. This provides a low electrical resistance or conducting condition for conducting current therethrough. The low electrical resistance is many orders of magnitude less than the high electrical resistance. The conducting condition is illustrated by the curve 22 and it is noted that there is a small deviation from a substantially linear voltage-current characteristic and a small deviation from a substantially constant voltage characteristic, the characteristics being the same for increase and decrease in current. In other words, current is conducted at somewhat near a substantially constant voltage. In the low resistance current conducting condition the semiconductor material has a voltage drop which is a minor fraction of the voltage drop in the high resistance-blocking condition near the threshold voltage value.

As the voltage is decreased, the current decreases along the line 22 and when the current decreases below a minimum current-holding value, the low electrical resistance of said at least one path immediately returns to the high electrical resistance as illustrated by the curves 23, 23' to reestablish the high resistance-blocking condition. In DC operation. The switching from the low resistance-conducting condition to the high resistance-blocking condition occurs along the curve 23' and sometimes in connection with AC operation the switching occurs along the solid curve 23. In either instance, however, the low electrical resistance immediately returns to the electrical high resistance when the current falls below the minimum current-holding value.

The switching device 10 of this invention is symmetrical in its operation, it blocking current substantially equally in each direction and it conducting current substantially equally in each direction, and the switching between the blocking and conducting conditions being extremely rapid. In the case of AC operation the voltage current characteristics for the second half-cycle of the AC current would be in the opposite quadrant from that illustrated in FIG. 2. The AC operation of the device is illustrated in FIGS. 3 and 4. FIG. 3 illustrates the device 10 in its blocking condition where the peak voltage of the AC voltage is below the threshold voltage value of the device, the blocking condition being illustrated by the curve 20 in both half-cycles. When, however, the peak voltage of the applied AC voltage increases above the threshold voltage value of the device, the device substantially instantaneously switches along the curves 21 to the conducting condition illustrated by the curves 22, the device switching during each half-cycle of the applied AC voltage. As the applied AC voltage nears zero so that the current through the device falls below the minimum current-holding value, the device switches along the curve 23 or 23' from the low electrical resistance condition to the high electrical resistance condition, illustrated by the curve 20, this switching occurring near the end of each half-cycle.

For a given configuration of the device 10, the high electrical resistance may be about 1 megohm and the low electrical resistance about 10 ohms, the threshold voltage value may be about 100 volts and the voltage drop across the device in the conducting condition may be less than 25 volts, and the switching times may be in nanoseconds or less.

The semiconductor material 11 which affords the above switching operations consists essentially of boron and one or more of carbon, silicon, titanium, germanium, zirconium or hafnium. Particularly good results are obtained where silicon is used with boron. The boron content should be high with respect to the silicon content, as for example, a range in atomic percent of about 75 percent to 86 percent or more boron and of about 25 percent to 14 percent or less silicon. Typical examples of a boron-silicon semiconductor material comprise boron (tri) silicide $B_3$ Si and boron (hexa) silicide $B_6$ Si.

Where carbon, titanium, germanium, zirconium or hafnium are used with boron, they should be used in a range in atomic percent below 20 percent to afford the above switching operations. Various of these elements may be substituted in part for the other, as for example, to provide a boron-silicon-carbon composition or the like.

In the preparation of the semiconductor materials of this invention, appropriate amounts of the materials in fine particulate form may be mixed and heated in an arc furnace or by an electron beam to high temperatures in the neighborhood of about 2,000° C. to form a fused mass of the material which is then allowed to cool to room temperature. Pieces or layers of desired dimensions may then be segregated from said mass and interposed between electrodes to form the switching device of this invention.

Alternatively, the fused mass may be subjected to sputtering or electron beam operations for depositing films or layers of the semiconductor material on suitable substrates to form the switching devices of this invention having electrodes contacting the semiconductor material. The step of forming the fused mass of semiconductor material may be eliminated and the mixture of the appropriate elements may be directly sputtered or vacuum deposited in layers or films on suitable substrates. When the semiconductor material is so sputtered or deposited on the substrate, it is believed that it is deposited in an amorphous state. Also, where the other elements which are added to the boron are normally incompatible therewith but which are deposited with the boron, the semiconductor material deposited therefrom will be in an amorphous state.

As another alternative, the fused mass may be converted into a fine particulate powder which may be placed between the electrodes, or which may be compacted into pellets and placed between the electrodes, or incorporated in a suitable paint and applied as layers or films to the electrodes, to form the switching device of this invention for obtaining the abovementioned switching.

Since boron is an element which is capable of forming polymeric structures, it is believed that the boron in conjunction with the other elements associated therewith forms a semiconductor material having a polymeric structure, whether it be crystalline or amorphous.

The electrodes 12 and 13 may be formed of any suitable electrical conducting material, preferably high melting point materials, which does not react unfavorably with the semiconductor material 10, such as tantalum, graphite, niobium, tungsten, molybdenum or the like. These electrodes are usually relatively inert with respect to the aforementioned semiconductor material.

It is believed that the breakdown by the applied voltage involved in the switching from the high electrical resistance to the low electrical resistance is essentially an electrical breakdown, and that the conducting process in the low electrical resistance condition is electronic conduction.

While for purposes of illustration several forms of this invention have been disclosed, other forms thereof may become apparent to those skilled in the art upon reference to this disclosure and, therefore, this invention is to be limited only by the scope of the appended claims.

I claim:

1. A switching device for an electrical circuit including a semiconductor material and electrodes in contact therewith, wherein said semiconductor material has a threshold voltage value and a minimum current-holding value and a high electrical resistance to provide a blocking condition for substantially blocking current therethrough, wherein said high electrical resistance in response to a voltage above said threshold voltage value substantially instantaneously decreases in at least one path between the electrodes to a low electrical resistance which is orders of magnitude lower than the high electrical resistance to provide a conducting condition for conducting current therethrough above said minimum current holding value, wherein the semiconductor material in the low electrical resistance-conducting condition has a voltage drop which is the same for increase and decrease in current and which is nearly substantially constant and which is a fraction of the voltage drop in the high electrical resistance-blocking condition near the threshold voltage value, and wherein said low electrical resistance of said at least one path of the semiconductor material in the conducting condition immediately returns to the high electrical resistance in response to a decrease in current below said minimum current-holding value which reestablishes the blocking condition, the improvement wherein, said semiconductor material consists essentially of boron and carbon, silicon, titanium, germanium, zirconium or hafnium.

2. A switching device as defined in claim 1, wherein said semiconductor material consists essentially of boron and silicon.

3. A switching device as defined in claim 1, wherein said semiconductor material consists essentially of boron and carbon.

4. A switching device as defined in claim 1, wherein said semiconductor material consists essentially of boron, silicon and carbon.

5. A switching device as defined in claim 1, wherein said semiconductor material is substantially amorphous.

6. A switching device as defined in claim 1, wherein the high electrical resistance-blocking condition is decreased to the low electrical resistance-conducting condition during each half-cycle responsive to the instantaneous voltage of an AC voltage above said threshold voltage value, and wherein the low electrical resistance-conducting condition is returned to the high electrical resistance-blocking condition during each half-cycle responsive to the instantaneous current of an AC current below said minimum current-holding value.